United States Patent [19]

Moberg

[11] Patent Number: 4,614,912
[45] Date of Patent: Sep. 30, 1986

[54] FM DEMODULATOR WITH TEMPERATURE COMPENSATION

[75] Inventor: Gregory O. Moberg, Rochester, N.Y.

[73] Assignee: Eastman Kodak Company, Rochester, N.Y.

[21] Appl. No.: 741,329

[22] Filed: Jun. 5, 1985

[51] Int. Cl.⁴ ............................................. H03D 3/00
[52] U.S. Cl. ..................................... 329/110; 455/214
[58] Field of Search ............... 329/107, 110, 126, 134; 375/82, 94, 95; 455/214, 216, 337

[56] References Cited

U.S. PATENT DOCUMENTS

| | | | |
|---|---|---|---|
| 3,778,727 | 12/1973 | Williams | 329/104 |
| 3,878,470 | 4/1975 | Boltz, Jr. | 329/126 |
| 4,282,490 | 8/1981 | Kusakabe | 329/103 |
| 4,339,726 | 7/1982 | Miura | 329/103 |
| 4,504,792 | 3/1985 | Furihata | 375/94 X |
| 4,507,795 | 3/1985 | Wagner | 375/95 |

FOREIGN PATENT DOCUMENTS 2342053 2/1974 Fed. Rep. of Germany ...... 329/126

OTHER PUBLICATIONS

Kybett, H., "Video Tape Recorders", *Howard W. Sams*, 1974, pp. 144–148.

*Primary Examiner*—Eugene R. LaRoche
*Assistant Examiner*—D. C. Mis
*Attorney, Agent, or Firm*—David M. Woods

[57] ABSTRACT

In a demodulator circuit for processing a frequency-modulated (fm) signal, two rectangular-wave signals of opposite phase are generated from the fm signal and separately processed in two similar circuit paths. Each circuit path includes an inverter that receives one of the rectangular-wave signals and a NOR gate that receives both the rectangular-wave signal and its inverted version from the inverter. By imparting a slight delay on positive-going transitions of the inverted signal, a pulse stream is produced by the NOR gate in coincidence with such transitions. The pulse streams from both paths are combined to obtain a resultant signal having a pulse repetition rate that is twice the frequency of the fm carrier. Temperature-caused pulse variations in one circuit path relative to the other . . . which will allow the fundamental carrier frequecy to reappear . . . are stabilized by having the inverters, and the NOR gates, in thermally-coupled packages.

15 Claims, 3 Drawing Figures

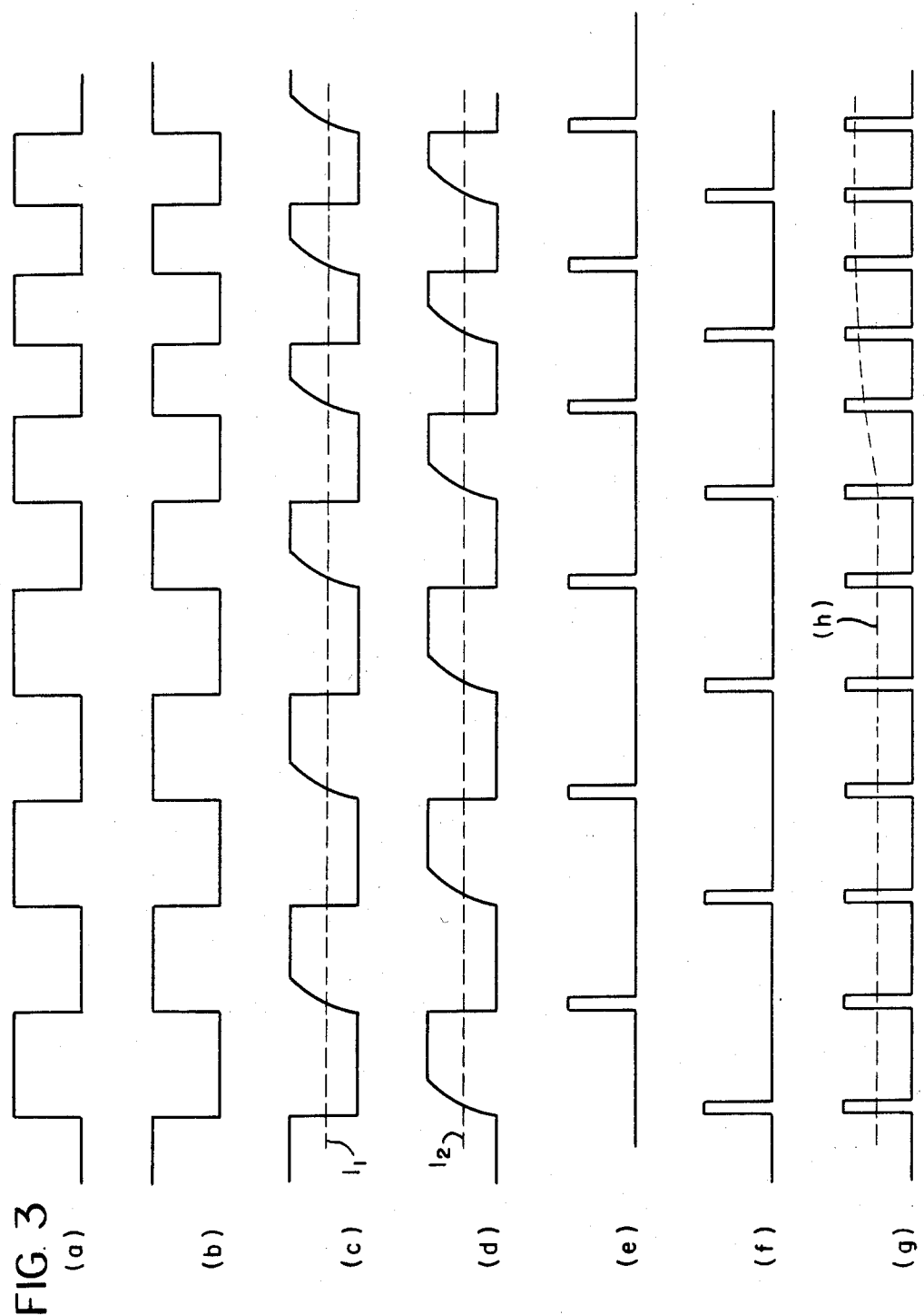

FM DEMODULATOR WITH TEMPERATURE COMPENSATION

BACKGROUND OF THE INVENTION

FIELD OF THE INVENTION

This invention relates to a demodulator circuit for processing frequency-modulated (fm) signals, especially fm video signals.

BRIEF DESCRIPTION OF THE DRAWINGS

The invention, as well as the prior art, will be described with respect to the drawings, in which:

FIG. 3 shows signal waveforms appearing in the circuit of FIG. 2.

DESCRIPTION RELATIVE TO THE PRIOR ART

In fm video systems, particularly those processing wide-band fm signals corresponding to a picture, the carrier frequency often deviates far enough to fall within the frequencies of the video signal modulating the carrier. A basic objective in demodulator design therefore is to move the carrier from which the video signal is recovered outside the range of video frequencies. Otherwise unwanted carrier frequencies will feed through the demodulator, despite low-pass filtering, and cause interference patterns in the reproduced picture.

In a well-known demodulator circuit design, the carrier is doubled in frequency before the video signal is recovered: The fm signal is initially processed by a limiter to remove amplitude fluctuations caused by extraneous signals and noise sources. The signal from the limiter is a frequency-varying rectangular-wave signal. This signal is differentiated to provide sharp pulses that are both positive- and negative-going. The negative-going pulses are inverted. At this point in the circuit, the pulses are all positive-going and occur at twice the frequency of the input rectangular-wave signal. In other words, the pulse repetition rate is twice the instantaneous frequency of the carrier input to the demodulator. The video frequencies represented by the pulse modulations, however, remain the same. The video signal is recovered by passing the frequency-doubled carrier through a pulse-integrating low-pass filter having a cutoff frequency between the highest video frequency and the doubled carrier frequency. (see Kybett, H. *Video Tape Recorders.* Indianapolis: Howard W. Sams, 1974, pp. 144–148).

Figure 1:
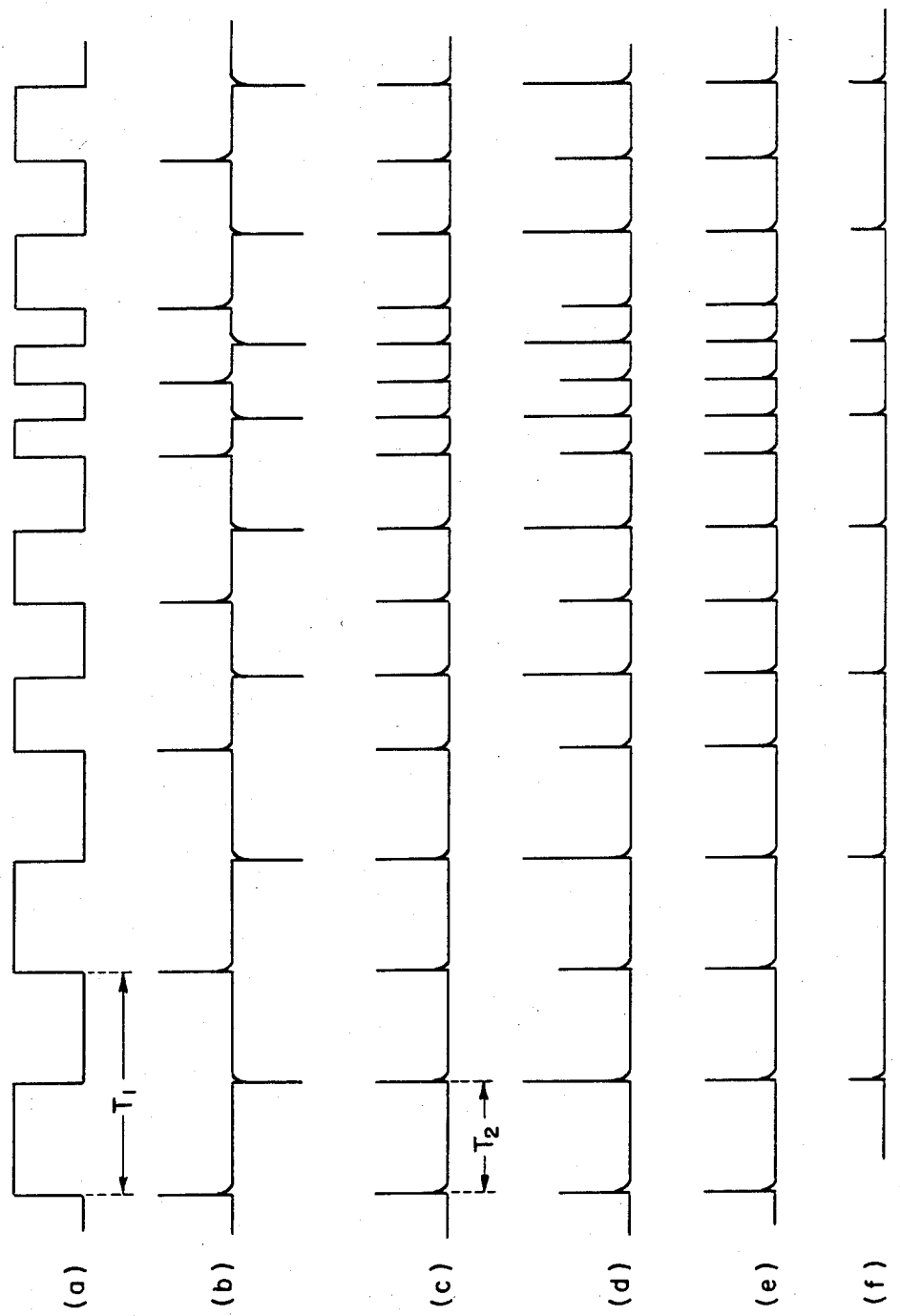
FIG. 1 shows signal waveforms helpful in explaining the problem in the prior art that is solved by the invention.

A pulse-doubling demodulator circuit is intended to reject the fundamental frequency of the carrier and to place the video signal upon its second harmonic. That is, the new carrier frequency (the second harmonic carrier) from which the video signal is recovered is placed outside the range of video frequencies. FIG. 1 helps in understanding this demodulation technique: FIG. 1(a) shows a typical rectangular-wave fm signal from a limiter. FIG. 1(b) shows the typical positive- and negative-going pulses caused by differentiating the signal of FIG. 1(a). When the negative-going pulses are inverted and combined with the positive-going pulses, as shown in FIG. 1(c), the resulting pulse stream has an instantaneous repetition rate twice the instantaneous frequency of the original fm signal of FIG. 1(a). That is, the instantaneous period $T_1$ of the fm signal of FIG. 1(a) is twice the instantaneous period $T_2$ of the pulse stream of FIG. 1(c). The pulse stream of FIG. 1(c) represents the new modulated carrier. The original video signal, in its original frequencies, is still contained in the pulse modulations of the frequency-doubled carrier. The fundamental carrier frequency has thus been rejected.

A problem comes in maintaining the continuity of rejection: The process of inversion is ordinarily performed in a circuit having dual signal paths . . . each circuit path in effect devoted to generating one set of positive-going pulses at the fundamental rate. The two sets are then combined to form the pulse stream at the doubled rate. If something happens in one signal path to affect pulse regularity . . . either as to width or amplitude . . . which does not happen, or does not happen to the same extent, in the other path, then the fundamental frequency is not totally rejected in the combined path. Again, FIG. 1 helps to explain this: assume something has happened . . . typically a circuit instability due to temperature change . . . to cause every other pulse of the pulse stream of FIG. 1(d) to be taller than the others. It then can be seen that the pulse stream of FIG. 1(d) has two components: a pulse stream as shown by Figure 1(e) having an instantaneous repetition rate that is twice the fundamental instantaneous frequency of the carrier and another pulse stream as shown by FIG. 1(f) having an instantaneous repetition rate that is the same as the fundamental instantaneous frequency. (The same result will obtain if the pulses are irregular as to width).

If the carrier component corresponding to the fundamental frequency is not completely eliminated it will feed through to the reproduced picture despite filtering (a low-pass filter cannot distinguish a fundamental carrier frequency within the video frequencies). For the known demodulator referred to above, a pair of diodes are used in the dual signal paths to pass the positive-going pulses; and a potentiometer balances their amplitudes at the point of combination. If the amplitude is at all unbalanced in the resulting signal then the fundamental carrier frequency will appear in the output of the demodulator. Since the conducting properties of the diodes are sensitive to temperature changes, it is difficult to keep the pulse amplitudes balanced. The fundamental frequency thus tends to feed through to the picture.

There are other types of demodulators that circumvent temperature instability but introduce still other problems, notably at high frequencies: U.S. Pat. No. 3,778,727 is an example of a class of demodulator using digital logic techniques: A square-wave fm signal is separately provided to both inputs of an exclusive-or gate. The gate receives the fm signal directly at one input and with a slight delay at the other input. The slight delay is provided by a multi-stage shift register. As the carrier frequency of the input square wave signal increases or decreases, the fixed delay provided by the shift register causes a corresponding increasing or decreasing phase shift between the signals applied to the gate. The exclusive-or gate generates a pulse each time both input signals are different, that is, at each transition point of the undelayed square-wave signal. The output pulse stream then has a repetition rate double that of the instantaneous carrier frequency of the input signal. Temperature stability is improved because the clock signal for the shift register is generated by a crystal-controlled oscillator. However these advantages are largely dependent upon the clock frequency being a large multiple of the center frequency of the carrier (256 times the center frequency in the case of the U.S. Pat. No. '727 patent, for a 64 stage register). When the clock frequency is of the order, or a small multiple, of the modulating frequencies, insufficient samples are taken for an accurate delayed signal (i.e., the Nyquist criterion has not been met and aliasing results).

The production of a pulse stream in which all pulses are alike—that is, equal as to width and height—and occur at twice the frequency of the input signal is therefore seen to pose special problems when the input signal is a wide-band fm signal. Differentiation circuits have been suggested, and used, but they require painstaking adjustment (and readjustment) because temperature instability disturbs the regularity of the pulses. Logic-based circuits tend to work best in low frequency systems where the sampling frequency of the delay element is many times the carrier frequency. Increasing the clock frequency is not always an acceptable expedient at high video frequencies (say, 5–10 mHz), where cost may be a large factor in commercial use of the demodulator. Integrating the entire temperature stability is concerned but unfortunately requires a customized demodulator chip to do the job.

SUMMARY OF THE INVENTION

A demodulator circuit according to the invention eliminates the fundamental carrier component of a frequency-modulated signal despite temperature instability of the constituent parts of the circuit. Two rectangular-wave signals, having opposite phases to each other, are generated from the fm signal. Each rectangular-wave signal is processed in a separate circuit path and the separate results of such processing are combined. Each path includes an inverter for inverting one of the rectangular-wave signals, a logic circuit for comparing the levels of the inverted and non-inverting rectangular-wave signal, and a circuit delay for providing a short delay to the positive-going edges of the inverted signal.

The circuit delay is exemplified by a pull-up resistor connected between the open drain output of the inverter and a voltage supply, and a shunt capacitor through which voltage pull-up occurs. A delay is obtained on rising transistions of the output by pulling up the output to the voltage supply with the pull-up resistor, but . . . importantly . . . subject to charging the shunt capacitance. If the logic circuit senses when both of its input signals are below a logic threshold (i.e., performs a NOR function), then a pulse is emitted at such positive-going transitions. When the pulse stream from both circuit paths are combined, the output signal has a pulse repetition rate that is twice the frequency of the input fm signal.

The advantage of such a demodulator circuit is that certain corresponding parts of the paired circuit paths can be thermally cross-coupled to eliminate the problem of thermal instability. This is done by having the inverters in both circuit paths, and the logic circuits (e.g., NOR gates) in both circuit paths, incorporated in respective integrated circuit packages. By this simple expendient temperature stability is achieved without going to the trouble of integrating the whole demodulator circuit. Instead, a few readily-available integrated circuit components will do the job.

DESCRIPTION OF THE PREFERRED EMBODIMENT

Figure 2:
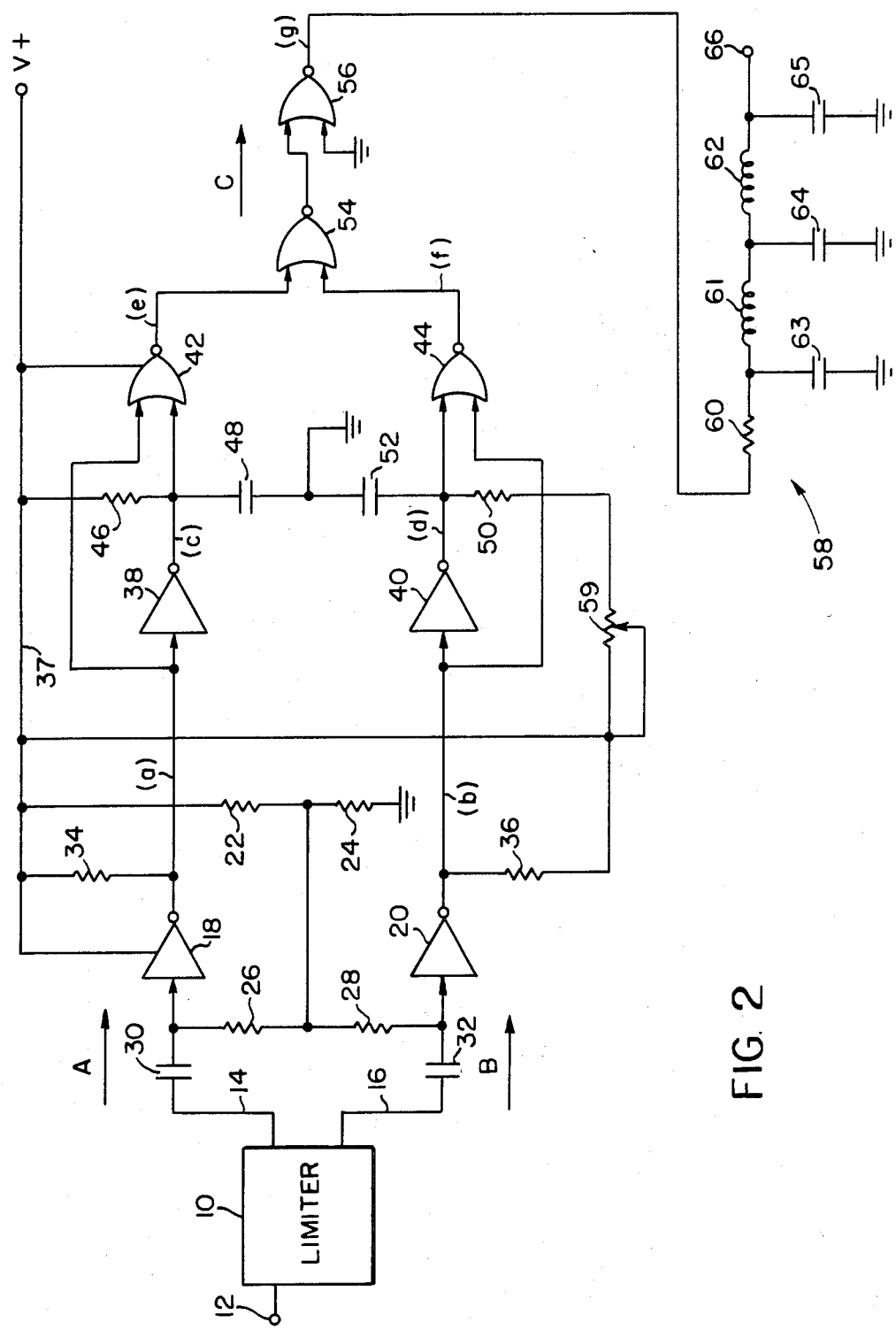
FIG. 2 is a circuit diagram of an fm demodulator according to the invention.

FIG. 2 shows a demodulator circuit for processing frequency-modulated signals. The fm signals are initially processed by a limiter 10 to eliminate all amplitude fluctuations. The limiter selected for use with the preferred embodiment is an MG1355 integrated limiter, available from Motorola Corporation. The limiter 10 receives an fm signal from an input terminal 12 and provides complementary output signals on the lines 14 and 16, that is, limited signals that are opposite in phase to each other. The complementary signals from the limiter 10 are separately processed in the demodulator circuit through respective circuit paths A and B, until being rejoined in a common circuit path C.

The limited signal on the lines 14 and 16 do not have the sharply defined edges of rectangular-waveforms, as needed by later stages of the demodulator circuit. A pair of inverters 18 and 20 are therefore provided in the respective circuit paths A and B for forming rectangular-wave signals from the limiter signals provided by the limiter 10. Resistors 22 and 24 form a voltage divider network for biasing the signals applied to the inverters 18 and 20. Resistors 26 and 28 further provide that the bias level for each inverter is substantially equal to its logic threshold.

A pair of coupling capacitors 30 and 32 in the respective circuit paths A and B pass the limited signals on the lines 14 and 16 to the inverters 18 and 20, introducing a reference voltage level (i.e., the bias level) on the output (i.e., inverter) side of each capacitor 30 and 32. By having the bias level equal to the logic threshold of each inverter 18 and 20, the proportion of the limited signal above the threshold equals the proportion below the threshold and the output signal from each inverter 18 and 20 thus acquires a fifty percent duty cycle. The particular inverter used in the preferred embodiment is a 75HC05 open-drain hex inverter available from Texas Instruments Corporation. Being that this inverter is an open-drain design, output resistors 34 and 36 (often referred to as pull-up resistors) are provided at the output of respective inverters 18 and 20 to pull the output voltages up to a source of supply voltage V+ provided on a line 37. Voltage pull-up occurs when the input voltage to etiher inverter drops to its low level. The resulting signal waveforms at the output of the inverters 18 and 20 are shown by the respective signal waveforms (a) and (b) of FIG. 3. Each signal is a rectangular-wave signal having a phase opposite to the other.

The rectangular-wave signal having the signal waveform (a) is supplied through the circuit path A to a further inverter 38 and to one input of a logic circuit 42. Meanwhile, in the other circuit path B the rectangular-wave signal having the signal waveform (b) is supplied to another inverter 40 and to one input of a logic circuit 44. The output of the inverter 38 is connected to the second input of the logic circuit 42; likewise the output of the inverter 40 is connected to the second input of the logic circuit 44. The logic circuits 42 and 44 generate respective high level outputs whenever both inputs are below a logic threshold (i.e., they perform a NOR function).

The inverters 38 and 40 are 75HC05 open-drain hex inverters and may in practice be combined in a single readily-available integrated circuit package with the inverters 18 and 20 (the 75HC05 inverter is a package of six like inverters, which is why the supply voltage V+ is shown connected only to the inverter 18). It is important to note that, for temperature stabilization, at least the inverters 38 and 40 are in one integrated circuit package in order to obtain thermal coupling. When so coupled, temperature-caused circuit variations will have the same effect in each circuit path. A suitable logic circuit is the 74HC02 NOR gate supplied by Texas Instruments Corporation. In order to obtain thermal coupling, the logic circuits 42 and 44 are in the same integrated circuit package. This is easily provided since the 74HC02 NOR gate includes four individual NOR gates (for that reason, the source of voltage supply V+ is connected only to the logic circuit 42).

For both inputs to the logic circuit 42 (or 44) to be simultaneously lower than a logic threshold (and the logic circuit therefore to have a high output) one of the input signals is delayed with respect to the other. A short, precise delay is imparted to the signal from the inverter 38 by a combination of a pull-up resistor 46 and a shunt capacitor 48; and to the signal from the inverter 40 by a combination of a pull-up resistor 50 and a shunt capacitor 52. Since the inverters 38 and 40 are of an open-drain design, an output resistance is desirable in any event to cause the output to be pulled up to the supply voltage V+ when the output transistor, which forms part of each inverter, cuts off. Any shunt output capacitance in the circuit must be charged through the output resistance.

By intentionally providing additional shunt capacitance in the form of the capacitors 48 and 52, current through the pull-up resistors 46 and 50 must fully charge the capacitors 48 and 52 before the output signals from the inverters 38 and 40 can reach the supply voltage V+. The effect of this is shown by the signal waveforms (c) and (d) of FIG. 3, where signal waveform (c) represents the output signal from the inverter 38 and the signal waveform (d) represents the output signal from the inverter 40. The time involved in charging the shunt capacitors 48 and 50 is represented by the exponentially rising edge of the positive-going transitions of the signal waveforms (c) and (d). The respective logic thresholds for causing the logic circuits 42 and 44 to switch are shown as $1_1$ and $1_2$ in FIG. 3. For example, the waveform (c) is the inverted version of the waveform (a) with a delayed pull-up on positive-going transitions. Since signals having the waveforms (a) and (c) are applied to the inputs of the logic circuit 42, there is a short time when both waveforms are less than the logic threshold $1_1$. The logic circuit 42 generates a pulse at such times as both inputs are lower than the threshold $1_1$, as shown by the signal waveform (e). Identical considerations apply to the waveform (d) generated by the output of the inverter 40 and applied, together with the undelayed signal having the signal waveform (b), to the logic circuit 44. The output from the logic circuit 44 is a pulse stream shown by a signal waveform (f).

The pulse signals generated by the logic circuits 42 and 44, and represented by the signal waveforms (e) and (f), each have a pulse repetition rate equal to the instantaneous frequency of the fm signal input to the limiter 10. The set of pulses comprising each pulse signal are offset with respect to the other set such that the pulse sets may be interleaved to obtain a combined signal. The respective pulse signals are combined in a pair of logic circuits 54 and 56 to form a composite pulse signal having the signal waveform (g) of FIG. 3. These logic circuits are preferably 74HC02 NOR gates and may be part of the integrated circuit package including the logic circuits 42 and 44. As will be noted by inspecting the signal waveform (g), the composite pulse signal has a pulse repetition rate that is twice the frequency of the input fm signal. This doubled rate is thus the instantaneous carrier of the video signal at this point in the demodulator circuit. Importantly, the new carrier is outside the range of the video frequencies and can be separated from the video signal by a low pass filter 58.

The fundamental carrier frequency, however, will feed through the demodulator circuit if the pulses forming the signal waveform (e) are not exactly equal in pulse width and pulse height to the pulses forming the signal waveform (f). A potentiometer 59 is therefore provided in series with one of the pull-up resistors 46 or 50 (which one does not matter) to finely adjust the slope of the exponentially-rising edges of the signal waveform (c) or (d) (whichever circuit path is having the adjustment). By such fine adjustment, the pulse widths of the pulses in the signal waveforms (e) and (f) can be made precisely equal. (Pulse heights are determined by the same logic supply (V+) for both pulse generating circuits and are the same for both signal waveforms (a) and (b)). It is a special feature of this circuit that temperature equally affects the operation of the inverters 38 and 40, and the logic circuits 42 and 44, because they are thermally-coupled by being in common integrated circuit packages. Though the individual inverters, and logic circuits, are not themselves thermally stable, any change in one ... that might affect pulse width ... will equally change the other and provide pulse widths in the composite signal waveform (g) that are equal for any given temperature. Pulse width can therefore be adjusted once during set-up by means of the potentiometer 59 and the pulse widths of successive pulses will remain identical despite changing operating temperature.

The low-pass filter 58 is comprised of a five-pole filter made up of series impedances (provided by a resistor 60 and inductors 61 and 62) and shunt capacitances (provided by capacitors 63, 64 and 65). The demodulated signal is provided at an output terminal 66. The demodulated signal generally tracks the rate at which pulses appear in the composite output waveform (g), providing a rising voltage as the pulses come faster and faster (as shown by a signal waveform (h) superimposed on the signal waveform (g)) and a falling voltage as the pulses come slower. The signal waveforms shown by FIG. 3 show the effect of an increase in frequency of the fm signal; a decrease in frequency would show the opposite effect. The simple variation in pulse repetition rate shown by FIG. 3 is for purposes of explanation; an actual fm signal, and the corresponding signal waveforms (e), (f), and (g) will be rapidly swinging between extreme frequencies, or pulse repetition rates, in correspondence with the amplitude and frequency of the modulating video signal.

The invention has been described in detail with particular reference to a presently preferred embodiment, but it will be understood that variations and modifications can be effected within the spirit and scope of the invention. For example, the invention has been described in connection with imparting a short delay to positive-going edges of the inverted signal by means of a pull-up resistor and a shunt capacitor. It would also be feasible, with minor circuit changes (such as the substitution of NAND logic for NOR logic), to impart a short delay to negative-going edges rather than positive-going edges. In this case one might use standard pushpull inverters (instead of open-drain) with a diode connected between each inverter output and the delay means: a shunt capacitor and a pull-down resistor, both connected to circuit ground. The pull-down during negative-going transitions would then be delayed by an amount dependent on the RC time constant of the shunt capacitor - pull-down resistor combination.

What is claimed is:

1. A demodulator circuit for processing a pair of oppositely-phased rectangular-wave signals derived from a frequency-modulated (fm) signal, said circuit comprising:

circuit means having a separate circuit path for processing each of said rectangular-wave signals, each circuit path including
(a) means for inverting a respective one of said rectangular-wave signals,
(b) means for delaying selected transitions of the inverted rectangular-wave signal said delaying means comprising voltage means for raising the output level of said inverting means to a predetermined level and means for providing a shunt capacitance which is charged by said voltge means in the course of raising said output level,
(c) means for generating a logic output from a combination of said respective rectangular-wave signal and said inverted rectangular-wave signal, said logic output comprising a stream of pulses which are generated whenever the levels of both signals of said combination of signals having a predetermined relationship relative to a logic threshold; and means for combining the logic output pulse streams from said logic generating means in each circuit path to obtain a composite pulse signal having a pulse repetition rate that is twice the carrier frequency of the fm signal.

2. A demodulator as claimed in claim 1 further comprising:

low pass filter means for generating a demodulated signal from the composite pulse signal output by said logic output combined means.

3. A demodulator as claimed in claim 1 in which said voltage means comprises a source of supply voltage and a resistor connected between said source and the output of said inverting means and said shunt capacitance means comprises a capacitor connected between the output of said inverting means and a circuit ground level.

4. A demodulator as claimed in claim 1 in which said logic generating means comprises a NOR logic gate.

5. A demodulator as claimed in claim 1 further comprising means in at least one of said circuit paths for adjusting said delaying means so that the output pulses from said logic generating means in each circuit path are substantially equal in pulse width.

6. A demodulator as claimed in claim 1 in which said inverting means in said separate circuit paths are thermally coupled such that temperature-caused circuit variations are identical.

7. A demodulator as claimed in claim 1 in which said logic generating means in said separate circuit paths are thermally coupled such that temperature-caused circuit variations are identical.

8. A demodulator circuit for processing a frequency modulated (fm) signal separated into two rectangular-wave signals having opposite phases, said circuit comprising:

circuit means having a separate signal path for processing each of said rectangular-wave signals, each signal path including
(a) an inverting circuit,
(b) a dual-input logic circuit for generating an output pulse signal whenever the logic levels at both inputs are lower than a logic threshold,
(c) a first circuit connection for supplying a respective one of said rectangular-wave signals to said inverting circuit and to an input of said logic circuit,
(d) a second circuit connection for supplying an output signal from said inverting circuit to the other input of said logic circuit,
(e) voltage means coupled to said second circuit connection for pulling the output voltage of said inverting circuit up to a predetermined level whenever said inverting circuit output switches from a low to a high logic level,
(f) means for providing a shunt capacitance at the output of said inverting circuit which is charged by said voltage means in the course of pulling said output voltage high; and means for combining the output pulse signals from the respective ones of said logic circuits in each signal path to obtain a composite pulse signal having a pulse repetition rate that is twice the carrier frequency of the fm signal.

9. A demodulator circuit as claimed in claim 8 in which said inverting circuit in each signal path is thermally coupled with the other by being formed in a common integrated circuit package.

10. A demodulator circuit as claimed in claim 9 in which said logic circuit in each signal path is thermally coupled with the other by being formed in a common integrated circuit package.

11. A demodulator circuit as claimed in claim 10 further comprising:

low pass filter means for separating a demodulated signal from the composite pulse signal obtained from said combining means, said low pass filter means having a cutoff frequency below the pulse repetition rate of the composite pulse signal.

12. A demodulator circuit for processing a frequency-modulated (fm) signal, said circuit comprising:

means responsive to the fm signal for generating first and second rectangular-wave signals having opposite phases to each other;

first and second thermally-coupled inverting circuits having output signal levels that are the inverse of their input signal levels;

first and second thermally-coupled dual-input logic circuits for generating an output pulse whenever the logic levels at both inputs are lower than a logic threshold;

first circuit means for supplying a) said first rectangular-wave signal to said first inverting circuit and to an input of said first logic circuit and b) said second rectangular wave signal to said second inverting circuit and to an input of said second logic circuit;

second circuit means for connecting a) the output of said first inverting circuit to the other input of said first logic circuit and b) the output of said second inverting circuit to the other input of said second logic circuit;

a source of supply voltage;

first and second shunt capacitors connected to respective outputs of said first and second inverting circuits;

output means connected to said second circuit means for respectively raising the output level of each inverter up to said supply voltage while charging the respective shunt capacitor, said rise in output level occurring when the respective inverter switches from a low to a high output level and providing a brief period during which the logic levels at both inputs to the respective logic circuit is lower than said logic threshold; and means for summing the outputs of said first and second logic circuits to obtain a composite pulse stream signal having a pulse repetition rate that is twice the carrier frequency of the fm signal.

13. The circuit as claimed in claim 12 addtionally comprising means for adjusting said output means with respect to the output level of one of said inverters so that said brief periods of simultaneously low logic levels are so balanced that respective output pulses generated by said logic circuits are substantially equal in width.

14. The circuit as claimed in claim 12 in which said first and second logic circuits comprise first and second NOR gates.

15. The circuit as claimed in claim 12 in which said output means comprises a pull-up resistor connected between said source of supply voltage and said second circuit means.

* * * * *